United States Patent
Ren et al.

(10) Patent No.: US 12,232,404 B2
(45) Date of Patent: Feb. 18, 2025

(54) DISPLAY SUBSTRATE AND MANUFACTURING METHOD THEREOF AND DISPLAY APPARATUS

(71) Applicants: Chengdu BOE Optoelectronics Technology Co., Ltd., Sichuan (CN); BOE TECHNOLOGY GROUP CO., LTD., Beijing (CN)

(72) Inventors: Huaisen Ren, Beijing (CN); Ke Yang, Beijing (CN); Tao Gao, Beijing (CN); Zubin Lv, Beijing (CN); Peng Hou, Beijing (CN); Yanqiang Wang, Beijing (CN); Yongzhan Han, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/319,435

(22) Filed: May 17, 2023

(65) Prior Publication Data
US 2023/0292579 A1    Sep. 14, 2023

Related U.S. Application Data

(62) Division of application No. 17/210,844, filed on Mar. 24, 2021, now Pat. No. 11,737,342.

(30) Foreign Application Priority Data

Jul. 28, 2020  (CN) .......................... 202010735058.6

(51) Int. Cl.
  *H10K 65/00*   (2023.01)
  *G06V 40/13*   (2022.01)
  (Continued)

(52) U.S. Cl.
  CPC ......... *H10K 65/00* (2023.02); *G06V 40/1318* (2022.01); *H10K 59/122* (2023.02);
  (Continued)

(58) Field of Classification Search
  CPC ...... H10K 59/40; H10K 59/65; H10K 59/122; H10K 59/124; H10K 59/125; H10K 59/1201; H10K 65/00; G06V 40/1318
  See application file for complete search history.

(56) References Cited

U.S. PATENT DOCUMENTS

2010/0320341 A1    12/2010   Cho et al.
2010/0321341 A1 *  12/2010   Cho ................... H01L 27/14687
                                                     257/E31.127
(Continued)

FOREIGN PATENT DOCUMENTS

CN    103915443 A    7/2014
CN    105304673 A    2/2016
(Continued)

OTHER PUBLICATIONS

China Patent Office, First Office Action dated Feb. 28, 2022, for corresponding Chinese application 202010735058.6.
(Continued)

*Primary Examiner* — Vongsavanh Sengdara
(74) *Attorney, Agent, or Firm* — HOUTTEMAN LAW LLC

(57) ABSTRACT

The present disclosure provides a display substrate and a manufacturing method thereof, and a display apparatus. The display substrate has a fingerprint identification region. The display substrate includes a base substrate; a display unit on the base substrate and including a display thin film transistor and a light-emitting device, a second electrode of the display thin film transistor being coupled to a first electrode of the light-emitting device; and a fingerprint identification unit at
(Continued)

a gap between adjacent display units in the fingerprint identification region and including a fingerprint identification transistor and a photosensitive device, a first electrode of the fingerprint identification transistor being coupled to a second electrode of the photosensitive device. The display substrate further includes a gate insulating layer on a side of an active layer of the display thin film transistor and an active layer of the fingerprint identification transistor distal to the base substrate.

9 Claims, 5 Drawing Sheets

(51) Int. Cl.
H10K 59/12 (2023.01)
H10K 59/122 (2023.01)
H10K 59/124 (2023.01)
H10K 59/125 (2023.01)
H10K 59/40 (2023.01)

(52) U.S. Cl.
CPC ......... H10K 59/124 (2023.02); H10K 59/125 (2023.02); *H10K 59/1201* (2023.02); *H10K 59/40* (2023.02)

(56) References Cited

U.S. PATENT DOCUMENTS

| | | | |
|---|---|---|---|
| 2012/0104530 A1* | 5/2012 | Kaneko | G06F 3/042 257/433 |
| 2012/0154530 A1 | 5/2012 | Kaneko et al. | |
| 2015/0364527 A1* | 12/2015 | Wang | H10K 59/40 257/40 |
| 2017/0289805 A1* | 10/2017 | Hong | H04W 12/08 |
| 2021/0029318 A1* | 1/2021 | Son | H04N 25/705 |
| 2021/0042493 A1* | 2/2021 | Lius | G06V 40/1318 |
| 2021/0342566 A1* | 11/2021 | Ishibe | H05B 33/02 |

FOREIGN PATENT DOCUMENTS

| | | | | |
|---|---|---|---|---|
| CN | 107480639 A | * | 12/2017 | ......... G02F 1/13338 |
| CN | 108710237 A | | 10/2018 | |
| CN | 109858443 A | | 6/2019 | |
| WO | WO2020102985 A1 | | 5/2020 | |

OTHER PUBLICATIONS

China Patent Office, third Office Action dated Nov. 15, 2022, for corresponding Chinese application 202010735058.6.

China Patent Office, Rejection Decision dated Mar. 1, 2023, for corresponding Chinese application 202010735058.6.

USPTO, Restriction Requirement issued on Aug. 30, 2022 for the U.S. Appl. No. 17/210,844.

USPTO, Office action issued on Dec. 19, 2022 for the U.S. Appl. No. 17/210,844.

USPTO, Notice of Allowance issued on Apr. 3, 2023 for the U.S. Appl. No. 17/210,844.

China Patent Office, Second Office Action dated Jul. 29, 2022, for corresponding Chinese application 202010735058.6.

* cited by examiner

DISPLAY SUBSTRATE AND MANUFACTURING METHOD THEREOF AND DISPLAY APPARATUS

This is a divisional application of U.S. patent application Ser. No. 17/210,844, filed Mar. 24, 2021, claiming the benefit to Chinese Application No. 202010735058.6, filed on Jul. 28, 2020, the content of each of which is hereby incorporated by reference in its entirety.

TECHNICAL FIELD

The present disclosure relates to the field of display technology, in particular to a display substrate and a manufacturing method thereof, and a display apparatus.

BACKGROUND

With the continuous development of display technologies, display apparatuses having biometric identification functions are gradually entering people's life. Among them, the fingerprint identification technology has uniqueness and stability, and becomes one of the most widely used and cheapest identification technologies in the biometric identification technology. The traditional optical fingerprint technology under the screen includes the small aperture imaging scheme in which the small aperture imaging is used and the collimation layer scheme in which a fingerprint identification module including a collimation layer is disposed below the display panel to realize the fingerprint identification function.

SUMMARY

As an aspect, a display substrate having a fingerprint identification region is provided. The display substrate includes a base substrate; a display unit on the base substrate and including a display thin film transistor and a light-emitting device, a second electrode of the display thin film transistor being coupled to a first electrode of the light-emitting device; and a fingerprint identification unit at a gap between adjacent display units in the fingerprint identification region and including a fingerprint identification transistor and a photosensitive device, a first electrode of the fingerprint identification transistor being coupled to a second electrode of the photosensitive device. The display substrate further includes a gate insulating layer on a side of an active layer of the display thin film transistor and an active layer of the fingerprint identification transistor away from the base substrate.

In an embodiment, the display substrate further includes an interlayer insulating layer on a side of the gate insulating layer away from the base substrate and covering a gate electrode of the display thin film transistor and a gate electrode of the fingerprint identification transistor; and an interlayer dielectric layer on a side of the interlayer insulating layer away from the base substrate.

In an embodiment, the photosensitive device is a planar PIN photodiode and includes a P-type semiconductor layer, an I-type semiconductor layer, and an N-type semiconductor layer which are sequentially arranged in a first direction parallel to the base substrate and in contact with each other; and the I-type semiconductor layer is between the P-type semiconductor layer and the N-type semiconductor layer.

In an embodiment, the P-type semiconductor layer, the I-type semiconductor layer and the N-type semiconductor layer of the photosensitive device, the active layer of the display thin film transistor, and the active layer of the fingerprint identification transistor are covered by the gate insulating layer. The N-type semiconductor layer of the photosensitive device is in contact with the active layer of the fingerprint identification transistor. A portion of the N-type semiconductor layer of the photosensitive device proximal to the active layer of the fingerprint identification transistor serves as the second electrode of the photosensitive device and the first electrode of the fingerprint identification transistor.

In an embodiment, the I-type semiconductor layer of the photosensitive device, first and second electrodes of the display thin film transistor, and first and second electrodes of the fingerprint identification transistor are on a side of the interlayer dielectric layer away from the base substrate. The first electrode of the fingerprint identification transistor is coupled to the second electrode of the photosensitive device through a via hole penetrating through the interlayer dielectric layer and the interlayer insulating layer.

In an embodiment, the photosensitive device further includes a transparent insulating layer completely covering the P-type semiconductor layer, the I-type semiconductor layer, and the N-type semiconductor layer. A first electrode of the photosensitive device is in contact with a side surface of the P-type semiconductor layer, and is in contact with an upper surface of the P-type semiconductor layer through a first via hole penetrating through the transparent insulating layer. The second electrode of the photosensitive device is in contact with a side surface of the N-type semiconductor layer, and is in contact with an upper surface of the N-type semiconductor layer through a second via hole penetrating through the transparent insulating layer.

In an embodiment, the photosensitive device further includes a transparent insulating layer covering only the I-type semiconductor layer. A first electrode of the photosensitive device is in contact with a whole side surface and a whole upper surface of the P-type semiconductor layer, and the second electrode of the photosensitive device is in contact with a whole side surface and a whole upper surface of the N-type semiconductor layer.

In an embodiment, the display substrate further includes a planarization layer on a side of the interlayer dielectric layer distal to the base substrate; a pixel defining layer on a side of the planarization layer distal to the base substrate and configured to define a plurality of pixel openings; an encapsulation layer configured to encapsulate the display unit, on a side of the pixel defining layer distal to the base substrate, in a third via holes penetrating through the pixel defining layer and the planarization layer; an insulating layer on a side of the encapsulation layer distal to the base substrate; and a cover plate on a side of the insulating layer distal to the base substrate.

In an embodiment, the photosensitive device is a vertical PIN photodiode and includes a second electrode, an N-type semiconductor layer, an I-type semiconductor layer, a P-type semiconductor layer, and a first electrode arranged on the encapsulation layer along a second direction from the encapsulation layer to the cover plate. The first electrode is a transparent electrode. The second electrode is a non-transparent electrode, is configured to block light emitted from the light-emitting device, and is coupled to the first electrode of the fingerprint identification transistor through a fourth via hole penetrating through the encapsulation layer in the third via hole. The photosensitive device is in the insulating layer and between the encapsulation layer and the cover plate.

In an embodiment, the display substrate further includes a spacer in the third via hole, covered by the encapsulation layer in the third via hole, and between the light-emitting device and the fourth via hole along a first direction parallel to the base substrate.

In an embodiment, the display substrate further includes a block dam in the pixel defining layer proximal to the encapsulation layer and between the spacer and the light-emitting device.

In an embodiment, the photosensitive device is a planar PIN photodiode and includes a P-type semiconductor layer, an I-type semiconductor layer, and an N-type semiconductor layer sequentially arranged in a first direction parallel to the base substrate and in contact with each other; the I-type semiconductor layer being between the P-type semiconductor layer and the N-type semiconductor layer. The P-type semiconductor layer, the I-type semiconductor layer and the N-type semiconductor layer of the photosensitive device are on a side of the insulating layer distal to the base substrate. The photosensitive device further includes a light shielding layer between the I-type semiconductor layer and the encapsulation layer and configured to shield light emitted by the light-emitting device. An orthographic projection of the light shielding layer on the base substrate completely overlaps an orthographic projection of the I-type semiconductor layer on the base substrate.

In an embodiment, the display substrate further includes a spacer in the third via hole, covered by the encapsulation layer in the third via hole, and between the light-emitting device and the fourth via hole along the first direction.

In an embodiment, the display substrate further includes a block dam in the pixel defining layer and between the spacer and the light-emitting device.

In an embodiment, the light-emitting device is one of red, green, blue sub-pixels.

As another aspect, a display apparatus including the display substrate described above is provided.

Yet another aspect, a method for manufacturing a display substrate is provided. The display substrate has a fingerprint identification region. The method includes forming a display unit on a base substrate, wherein the display unit includes a display thin film transistor and a light-emitting device, and a second electrode of the display thin film transistor is coupled to a first electrode of the light-emitting device; forming, at a gap between adjacent display units in the fingerprint identification region, a fingerprint identification unit including a fingerprint identification transistor and a photosensitive device, such that a first electrode of the fingerprint identification transistor is coupled to a second electrode of the photo sensitive device; and forming a gate insulating layer on a side of an active layer of the display thin film transistor and an active layer of the fingerprint identification transistor distal to the base substrate.

DETAILED DESCRIPTION

Figure 1:
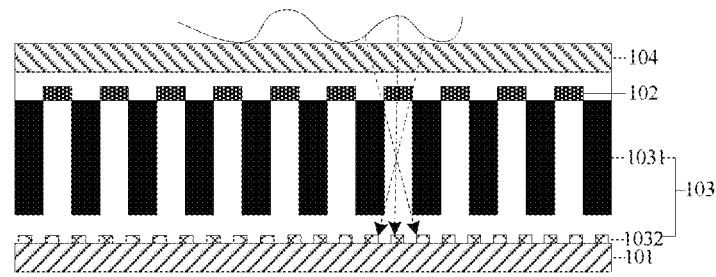
FIG. 1 is a schematic diagram showing a structure of a display substrate according to the related art.

In order to enable those skilled in the art to better understand the technical solutions of the present disclosure, the present disclosure will be further described in detail below in conjunction with the drawings and the specific embodiments.

A thin film transistor in the display substrate described below may be any one of the transistors in the display unit. An example in which the thin film transistor serves as a driving transistor of the display unit in the related art and in embodiments of the present disclosure will be described. It is understood that the switching transistor may have the same structure as the driving transistor and be made in the same way as that of the driving transistor, and thus will not be described in detail herein. Alternatively, a field effect transistor or other similar devices with other characteristics may be used. Source electrode of the thin film transistor cannot be distinguished from drain electrode of the thin film transistor, because the source electrode and the drain electrode of the thin film transistor are symmetrical. In order to distinguish the source and drain electrodes of the thin film transistor, one of the electrodes is called a first electrode, the other electrode is called a second electrode, and the gate electrode is called a control electrode. In addition, the transistors can be divided into N-type and P-type transistors according to the characteristics of the thin film transistor. In the following embodiment, the N-type transistor will be illustrated. When an N-type transistor is used, the first electrode is a source electrode of the N-type transistor, and the second electrode is a drain electrode of the N-type transistor. When a high voltage level is input into the gate electrode, the source and drain electrodes are electrically coupled to each other. When a P-type transistor is used, the opposite is true. It should be noted that implementation with the P-type transistors is readily apparent to those skilled in the art without inventive step, and thus the solution using the P-type transistors falls within the scope of the disclosed embodiments. Specifically, the light-emitting device may be an organic electroluminescent diode in a display unit or other types of light-emitting devices. The organic electroluminescent diode is taken as an example in the related art and in the embodiments of the present disclosure. The organic electroluminescent diode includes a first electrode and a second electrode, the first electrode is an anode of the organic electroluminescent diode, and the second electrode is a cathode of the organic electroluminescent diode. Specifically, the photosensitive device may be a PIN photodiode or a PN photodiode. The PIN photodiode is taken as an example for illustration in the related art and in the embodiments of the present disclosure. The PIN photodiode includes a first electrode and a second electrode, the first electrode is an anode of the PIN photodiode, and the second electrode is a cathode of the PIN photodiode.

FIG. 1 is a schematic diagram showing a structure of a display substrate in the related art. As shown in FIG. 1, the display substrate has a fingerprint identification function, and the display substrate includes: a base substrate 101, a plurality of display units 102 on the base substrate 101, and a fingerprint identification unit 103 between the base substrate 101 and the plurality of display units. The fingerprint identification unit 103 includes a collimation layer 1031 and a photosensitive device 1032. Generally, a glass cover plate 104 covers over the display units 102. After being reflected by a valley and ridge of a finger, light emitted by the display unit 102 enters the collimation layer 1031 after passing through the glass cover plate 104 and the display unit 102. The collimation layer 1031 filters out refracted and scattered light, and the collimated light is irradiated onto the photosensitive device 1032 to obtain a relatively clear fingerprint image, so that the fingerprint identification function is realized. Due to the existence of the glass cover plate 104, the display unit 102 and the collimation layer 1031, a path from the photosensitive device 1032 to the finger on the surface of the display substrate has a distance about 0.5 mm, and the light transmitted in the path has a large loss, the obtained fingerprint image cannot meet the requirement of fingerprint identification, and the precision of fingerprint identification is influenced. At the same time, the collimation layer 1031 and the photosensitive device 1032 are both located in separate film layers, therefore display substrate has a poor integration level, which is not conducive to the thinning of the display substrate.

Figure 2:
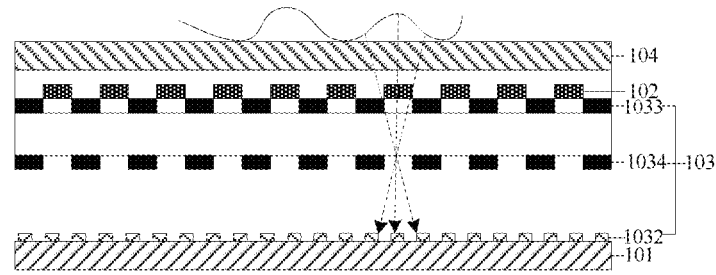
FIG. 2 is a schematic diagram showing a structure of another display substrate according to the related art.

FIG. 2 is a schematic diagram showing a structure of another display substrate in the related art. As shown in FIG. 2, the display substrate is different from the display substrate shown in FIG. 1 in that the collimation layer 1031 is replaced by a first thin film layer 1033 and a second thin film layer 1034 both having small holes, with a light-transmitting material between the first thin film layer 1033 and the second thin film layer 1034. Light is irradiated onto the photosensitive device 1032 through the structure for the small aperture imaging, so as to realize the fingerprint identification function.

At present, the technical problems of lower identification precision and poor integration level with a display substrate exist in the collimation layer scheme or the small aperture imaging scheme. In order to solve the above technical problems in the related art, the embodiments of the present disclosure provide a display substrate and a display apparatus, which will be described in further detail with reference to the accompanying drawings and detailed description.

Figure 3:
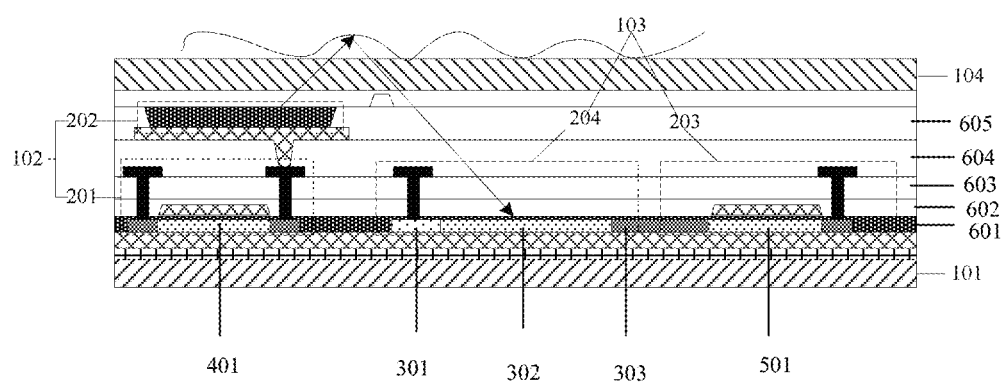
FIG. 3 is a schematic diagram showing a structure of a display substrate according to an embodiment of the present disclosure.

FIG. 3 is a schematic diagram showing a structure of a display substrate according to an embodiment of the present disclosure. As shown in FIG. 3, the display substrate includes: a base substrate 101, a plurality of display units 102 on the base substrate 101, and a fingerprint identification unit 103 at a gap between adjacent display units 102. The display unit 102 includes: a first thin film transistor 201 (i.e., a display thin film transistor) and a light-emitting device 202. A drain electrode of the first thin film transistor 201 is coupled to an anode of the light-emitting device 202. The fingerprint identification unit 103 includes: a second thin film transistor 203 (i.e., a fingerprint identification transistor) and a photosensitive device 204; a source electrode of the second thin film transistor 203 is coupled to a cathode (i.e., a second electrode) of the photosensitive device 204.

In the present disclosure, the light-emitting device 202 refers to a sub-pixel such as a red sub-pixel, a green sub-pixel, or a blue sub-pixel.

In an embodiment, the fingerprint identification unit is located at a gap between adjacent display units in the fingerprint identification region of the display substrate. The fingerprint identification region may be a portion of the display region of the display substrate, and alternatively, the fingerprint identification region may occupy the entire display region of the display substrate.

The display substrate includes: a gate insulating layer 601 located on a side of an active layer 401 of the display thin film transistor 201 and an active layer 501 of the fingerprint identification transistor 203 distal to the base substrate 101; an interlayer insulating layer 602 located on a side of the gate insulating layer 601 distal to the base substrate 101 and covers a gate electrode 401 of the display thin film transistor 201 and a gate electrode 501 of the fingerprint identification transistor 203; an interlayer dielectric layer 603 on a side of the interlayer insulating layer 602 distal to the base substrate 101; a planarization layer 604 located on a side of the interlayer dielectric layer 603 distal to the base substrate 101; and a pixel defining layer 605 located on a side of the planarization layer 604 distal to the base substrate 101 and configured to define a plurality of pixel openings.

In the display substrate according to an embodiment of the present disclosure, the light-emitting device 202 may emit light under the driving of the first thin film transistor 201. Light emitted by the light-emitting device 202 is reflected by the valley and ridge of the finger and then irradiates on the photosensitive device 204. The photosensitive device 204 may convert a signal of light reflected by the valley and ridge of the finger into a current signal and transmit the current signal through the second thin film transistor 203. The light emitted by the light-emitting device 202 is directly reflected by the ridge of the finger when the light reaches the display substrate. The light emitted by the light emitting device 202 is reflected by the valley of the finger when the light reaches the display substrate and penetrates through the air between the valley of the finger and the display substrate, and the ridge of the finger reflects the light back to the display substrate. Due to the loss caused in the propagation of light in the air, the intensities of the light beams received by the photosensitive device 204 corresponding to the valley and the ridge respectively are different from each other, so that the currents corresponding to the valley and the ridge in the photosensitive device 204 are different too, and further, the fingerprint identification function can be realized. In the embodiment of the present disclosure, the second thin film transistor 203 and the photosensitive device 204 in the fingerprint identification unit 103 are located at the gap between the adjacent display units 102. The fingerprint identification unit 103 and the display units 102 are integrated together while the fingerprint identification function is implemented, thereby facilitating the thinning of the display substrate without increasing the thickness of the entire display substrate. Furthermore, a path between the photosensitive device 204 and the valley and ridge of the finger has a small distance, light propagating in the path has a reduced propagation distance and a low loss, and the fingerprint identification precision can be improved.

Figure 4:
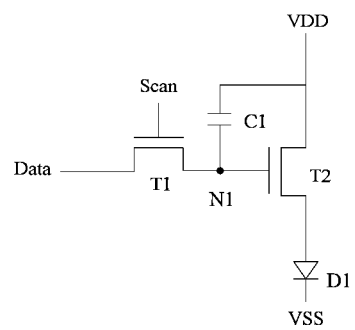
FIG. 4 is a schematic diagram showing a circuit of a display unit according to an embodiment of the present disclosure.

In some embodiments, FIG. 4 is a schematic diagram showing a circuit structure of a display unit according to an embodiment of the present disclosure. As shown in FIG. 4, the display unit includes: a first switching transistor T1, a driving transistor T2, a first capacitor C1, and a light-emitting device D1. The first switching transistor T1 has a gate electrode coupled to a scan line Scan, a source electrode coupled to data line Data, and a drain electrode coupled to a first node N1. The first node N1 is a connection point where the drain electrode of the first switching transistor T1, one terminal of the first capacitor C1, and a gate electrode of the driving transistor T2 are coupled to each other. The driving transistor T2 has a gate electrode coupled to the first node N1, a source electrode coupled to the first power line VDD, and a drain electrode coupled to an anode of the light-emitting device D1. One terminal of the first capacitor C1 is coupled to the first node N1, and the other terminal is coupled to the source electrode of the driving transistor T2 and the first power line VDD. The light-emitting device D1 has an anode coupled to the drain electrode of the driving transistor T2 and a cathode coupled to a second power source line VSS. The voltage input into the first power line VDD is greater than the voltage input into the second power line VSS, and a certain voltage difference exists between the voltage input into the first power line VDD and the voltage input into the second power line VSS. A driving current is formed when the driving transistor T2 is turned on, and the light-emitting device D1 emits light under the driving of the driving current, so that a display function is realized.

Figure 5:
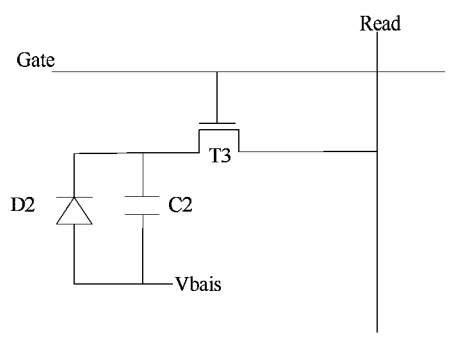
FIG. 5 is a schematic diagram showing a circuit of a fingerprint identification unit according to an embodiment of the present disclosure.

In some embodiments, FIG. 5 is a schematic diagram showing a circuit structure of a fingerprint identification unit according to an embodiment of the present disclosure. As shown in FIG. 5, the fingerprint identification unit includes: a second switching transistor T3, a photosensitive device D2 and a second capacitor C2. The second switching transistor T3 has a gate electrode coupled to a control signal line Gate, a source electrode coupled to a cathode (i.e., a second electrode) of the photosensitive device D2, and a drain electrode coupled to a read signal line Read. An anode (i.e., a first electrode) of the photosensitive device D2 is coupled to one terminal of the second capacitor C2 and a bias signal line Vbias. One terminal of the second capacitor C2 is coupled to the bias signal line Vbias and the anode of the photosensitive device D2, and the other terminal is coupled to the source electrode of the second switching transistor T3 and the cathode of the photosensitive device D2. The photosensitive device D2 is turned on to form an induced current under environment light and the induced current is stored in the second capacitor C2. When the second switching transistor T3 is turned on, the induced current may be transmitted through the second switching transistor T3. The light emitted by the light-emitting device D1 is directly reflected by the ridge of the finger when the light reaches the display substrate. The light emitted by the light emitting device D1 can be reflected by the valley of the finger when the light reaches the display substrate and penetrates through the air between the valley of the finger and the display substrate, and the ridge of the finger reflects the light back to the display substrate. Due to the loss caused in the propagation of light in the air, the intensities of the light beams received by the photosensitive device D2 corresponding to the valley and the ridge are different from each other, and thus the current corresponding to the valley and the ridge in the photosensitive device D2 are different, and the fingerprint identification function may be further implemented.

It is illustrated that the schematic diagrams showing structures of display substrate in FIG. 3 and the following FIGS., the first thin film transistor 201 corresponds to the driving transistor T2 in FIG. 4, the light-emitting device 202 corresponds to the light-emitting device D1 in FIG. 4, the second thin film transistor 203 corresponds to the second switching transistor T3 in FIG. 5, and the photosensitive device 204 corresponds to the photosensitive device D2 in FIG. 5. For convenience of description, the first capacitor C1, the second capacitor C2, and corresponding traces, and the like are not shown in schematic diagrams showing structures of the display substrate in FIG. 3 and the following FIGS.

In some embodiments, as shown in FIG. 3, the photosensitive device 204 includes a first semiconductor layer 301, an intrinsic semiconductor layer 302, and a second semiconductor layer 303 disposed in the same layer; the intrinsic semiconductor layer 302 is located between the first semiconductor layer 301 and the second semiconductor layer 302. The intrinsic semiconductor layer 302 is disposed on the same layer as an active layer of the first thin film transistor 201 and an active layer of the second thin film transistor 203.

It should be noted that the photosensitive device 204 in the embodiment of the present disclosure may be a planar PIN photodiode, in which the first semiconductor layer 301 is a P-type semiconductor layer, the second semiconductor layer 303 is an N-type semiconductor layer, and the I-type semiconductor layer 302 is located between the P-type semiconductor layer 301 and the N-type semiconductor layer 303. P-type ions and N-type ions may be implanted into the organic silicon layer by using an ion implantation process to form the P-type semiconductor layer 301 and the N-type semiconductor layer 302. During the ion implantation process, a portion where the ion implantation is not required is covered and shielded by photoresist, so as to form the planar PIN photodiode. In the embodiment of the present disclosure, the I-type semiconductor layer 302 of the planar PIN photodiode is disposed on the same layer as the active layer 401 of the first thin film transistor 201 and the active layer 501 of the second thin film transistor 203, and thus may be formed by using the same process, so as to reduce the manufacturing steps and the manufacturing cost. Meanwhile, the thickness of the whole display substrate is not increased, which facilitates the lightness and thinning of the display substrate. In addition, the pass from the I-type semiconductor layer 302 of the planar PIN photodiode to the valley and ridge of the finger has a small distance, light propagating in the pass has a reduced transmission distance and a low loss of light signals, so that the fingerprint identification precision can be improved.

In some embodiments, the second semiconductor layer 303 is in contact with the active layer 501 of the second thin film transistor 203; a portion of the second semiconductor layer 303 proximal to the active layer 501 of the second thin film transistor 203 serves as the cathode of the photosensitive device 204 and the source electrode of the second thin film transistor 203.

In some embodiments, the P-type semiconductor layer 301, the I-type semiconductor layer 302 and the N-type semiconductor layer 303 of the photosensitive device, the active layer 401 of the display thin film transistor 201, and the active layer 501 of the fingerprint identification transistor 203 are covered by the gate insulating layer 601. The N-type semiconductor layer 303 of the photosensitive device is in contact (e.g., in direct contact) with the active layer 501 of the fingerprint identification transistor 203. A portion of the N-type semiconductor layer 303 of the photosensitive device proximal to the active layer 501 of the fingerprint identification transistor 203 serves as the second electrode of the photosensitive device and the first electrode of the fingerprint identification transistor.

It should be noted that the signal lines such as the data lines, the scan lines, the read signal lines, the control signal lines, and the power lines are usually made of a metal material. In practical applications, specifically, the wiring layers of the signal lines are disposed in the same layer as the source electrode and the drain electrode of the first thin film transistor 201 and the source electrode and the drain electrode of the second thin film transistor 203, and are formed by the same process. The P-type semiconductor layer 301 of the planar PIN photodiode is coupled to the bias signal line in the wiring layer through a via hole penetrating through the gate insulating layer and the interlayer insulating layer on the P-type semiconductor layer 301. Since the N-type semiconductor layer 303 and the active layer 501 of the second thin film transistor 203 are disposed on the same layer, the N-type semiconductor layer 303 and the active layer 501 of the second thin film transistor 203 can be in contact (e.g., in direct contact) with each other to form an electrical connection. A portion of the N-type semiconductor layer 303 of the photosensitive device 204 proximal to the active layer 501 of the second thin film transistor 203 may be used as the cathode of the photosensitive device 204 and a source electrode of the second thin film transistor 203. In this way, it is not required to form the cathode of the photosensitive device 204 and the source electrode of the second thin film transistor 203 by punching, thereby reducing process steps and manufacturing cost.

Figure 6:
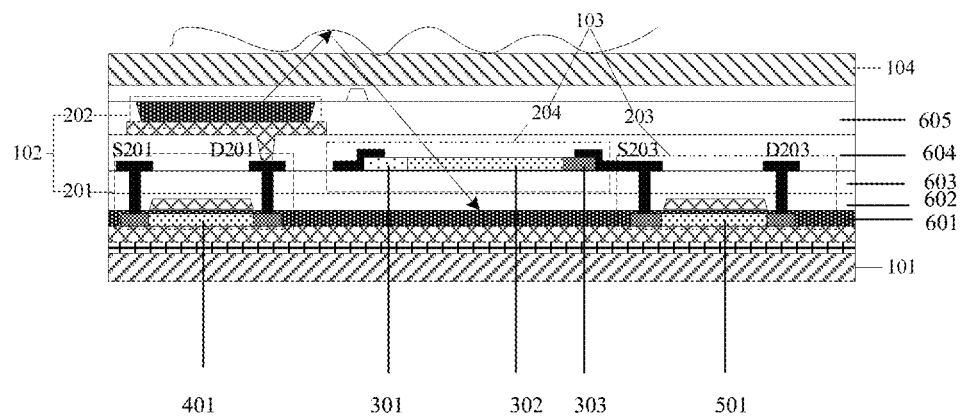
FIG. 6 is a schematic diagram showing a structure of a display substrate according to an embodiment of the present disclosure.

In some embodiments, as shown in FIG. 6, the photosensitive device 204 includes a first semiconductor layer 301, an intrinsic semiconductor layer 302, and a second semiconductor layer 303 disposed on the same layer; the intrinsic semiconductor layer 302 is located between the first semiconductor layer 301 and the second semiconductor layer 302. The intrinsic semiconductor layer 302 is disposed on the same layer as the source electrode and drain electrode of the first thin film transistor 201 and the source electrode and drain electrode of the second thin film transistor 203.

It should be noted that the photosensitive device 204 in the embodiment of the present disclosure may be a planar PIN photodiode, in which the first semiconductor layer 301 is a P-type semiconductor layer, the second semiconductor layer 303 is an N-type semiconductor layer, and the I-type semiconductor layer 302 is located between the P-type semiconductor layer and the N-type semiconductor layer.

In some embodiments, the I-type semiconductor layer 302 of the photosensitive device, the source electrode S201 and the drain electrode D201 of the display thin film transistor 201, and the source electrode S203 and the drain electrode D203 of the fingerprint identification transistor 203 are located on a side of the interlayer dielectric layer 603 distal to the base substrate 101. The source electrode S203 of the fingerprint identification transistor 203 is coupled to the second electrode of the photosensitive device through a via hole penetrating through the interlayer dielectric layer 603 and the interlayer insulating layer 602.

P-type ions and N-type ions may be implanted into the silicone layer using an ion implantation process to form the P-type semiconductor layer 301 and the N-type semiconductor layer 303. During the ion implantation process, a portion that does not require to be subjected to ion implantation may be covered and shielded by photoresist, so as to form the planar PIN photodiode. In the embodiment of the present disclosure, the I-type semiconductor layer 302 of the planar PIN photodiode is disposed on the same layer as the source electrode and the drain electrode of the first thin film transistor 201 and the source electrode and the drain electrode of the second thin film transistor 203, and may be formed by the same process, so as to reduce the manufacturing steps and manufacturing cost. Meanwhile, the thickness of the whole display substrate may not be increased, which facilitates the lightness and thinning of the display substrate. Furthermore, compared with the above embodiment in which the I-type semiconductor layer 302 is disposed on the same layer as the active layer 401 of the first thin film transistor 201 and the active layer 501 of the second thin film transistor 203, the I-type semiconductor layer 302 of the photosensitive device 204 is closer to the valley and ridge of the finger, which further reduces the distance between the I-type semiconductor layer 302 of the planar PIN photodiode and the valley and ridge of the finger, thereby further reducing the propagation distance of light and the loss of optical signals, and further improving the accuracy of fingerprint identification.

Figure 7:
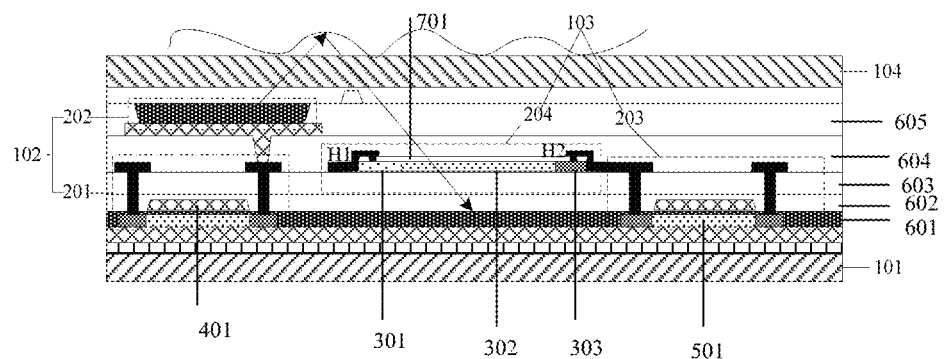
FIG. 7 is a schematic diagram showing a structure of a display substrate according to an embodiment of the present disclosure.

In some embodiments, as shown in FIG. 7, the photosensitive device 204 further includes a transparent insulating layer 701 covering (e.g., completely covering) the first semiconductor layer, the intrinsic semiconductor layer, and the second semiconductor layer. An anode (i.e., a first electrode) of the photosensitive device 204 is in contact with the first semiconductor layer 301 through a first via hole that penetrates through the transparent insulating layer 701, and the cathode of the photosensitive device 204 is in contact with the second semiconductor layer 303 through a second via hole that penetrates through the transparent insulating layer 701.

It should be noted that, the transparent insulating layer 701 covers film layers 301, 302, 303 of the planar PIN photodiode, so that light may penetrate through the transparent insulating layer 701 and irradiate onto the I-type semiconductor layer 302. When the source electrode and drain electrode of the first thin film transistor 201, and the source electrode and drain electrode of the second thin film transistor 203 are formed by using an etching process, damage or metal residue on a side surface of the planar PIN photodiode caused by etching can be prevented, thereby preventing the problem of poor optical signal reception or generation of a large leakage current caused by surface damage of the planar PIN photodiode. The anode and cathode of the planar PIN photodiode may be formed in the same manner as the source and drain electrodes of the first and second thin film transistors 201 and 203, and may be electrically coupled to the P-type semiconductor layer and the N-type semiconductor layer through the first and second via holes penetrating through the transparent insulating layer, respectively.

In some embodiments, the photosensitive device further includes a transparent insulating layer 701 completely covering the P-type semiconductor layer 301, the I-type semiconductor layer 302, and the N-type semiconductor layer 303. A first electrode of the photosensitive device is in contact with a side surface of the P-type semiconductor layer 301 and is in contact with an upper surface of the P-type semiconductor layer 301 through a first via hole H1 penetrating through the transparent insulating layer 701. The second electrode of the photosensitive device is in contact with the side of the N-type semiconductor layer 303 and is in contact with the upper surface of the N-type semiconductor layer 303 through a second via hole H2 penetrating through the transparent insulating layer 701.

Figure 8:
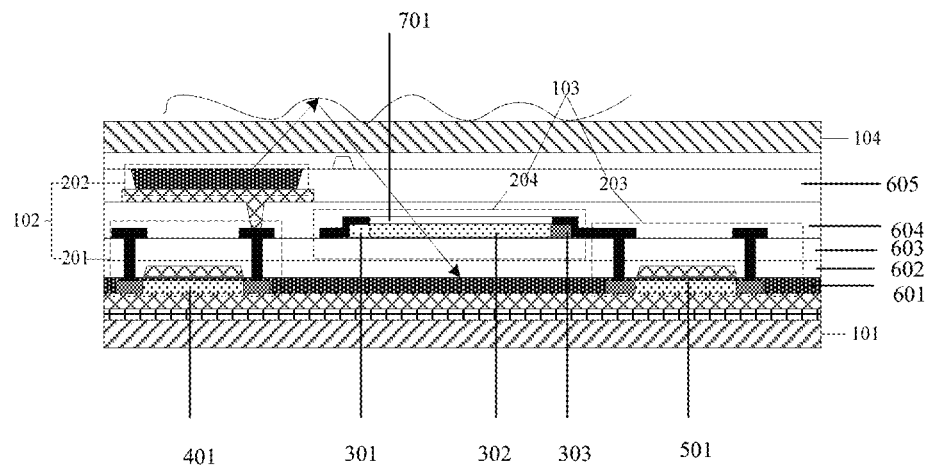
FIG. 8 is a schematic diagram showing a structure of a display substrate according to an embodiment of the present disclosure.

In some embodiments, as shown in FIG. 8, the photosensitive device 204 further includes a transparent insulating layer 701 covering only the intrinsic semiconductor layer. The anode of the photosensitive device 204 is in contact with the first semiconductor layer 301, and the cathode of the photosensitive device 204 is in contact with the second semiconductor layer 303.

In some embodiments, the photosensitive device further includes a transparent insulating layer 701 covering only the I-type semiconductor layer 302 and not covering the P-type semiconductor layer 301 and the N-type semiconductor layer 303. The first electrode of the photosensitive device is in contact with the whole side and whole top surfaces of the P-type semiconductor layer 301. The second electrode of the photosensitive device is in contact with the whole side and whole top surfaces of the N-type semiconductor layer 303.

It should be noted that during the manufacturing process, forming the transparent insulating layer 701 on the film layers of the planar PIN photodiode includes: partially etching the transparent insulating layer 701 on the P-type semiconductor layer 301 and the N-type semiconductor layer 303 of the planar PIN photodiode to expose the P-type semiconductor layer and the N-type semiconductor layer, and forming the anode and the cathode respectively on the exposed P-type semiconductor layer and the exposed N-type semiconductor layer. In this way, the I-type semiconductor layer may not be damaged, and the anode and the cathode are respectively coupled to the P-type semiconductor layer and the N-type semiconductor layer without punching, thereby reducing the manufacturing steps and manufacturing cost.

Figure 9:
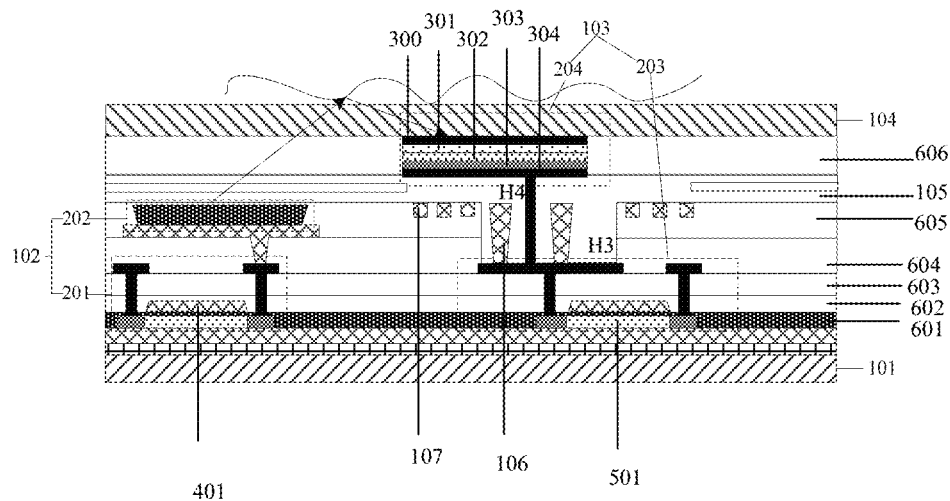
FIG. 9 is a schematic diagram showing a structure of a display substrate according to an embodiment of the present disclosure.

In some embodiments, as shown in FIG. 9, the display substrate further includes: an encapsulation layer 105 covering the light-emitting device 202. For example, the encapsulation layer 105 is a stacked layer of two inorganic encapsulation layers and one organic encapsulation layer between the two inorganic encapsulation layers. The encapsulation layer 105 may encapsulate the plurality of display elements, on a side of the pixel defining layer 605 distal to the base substrate 101, in a third via holes H3 that extend through the pixel defining layer 605 and the planarization layer 604. The display substrate further includes an insulating layer 606, which is an organic insulating layer and is located on a side of the encapsulation layer 105 distal to the base substrate 101. A glass cover plate 104 is located on a side of the insulating layer 606 distal to the base substrate 101.

The photosensitive device 204 includes a cathode 304, a second semiconductor layer 303, an intrinsic semiconductor layer 302, a first semiconductor layer 301 and an anode 300 arranged in that order on the encapsulation layer 105 in the direction from the encapsulation layer 105 to the glass cover plate 104. The anode 300 is a transparent electrode, and the cathode 304 is a non-transparent electrode.

The photosensitive device is located in the organic insulating layer 606 and between the encapsulation layer 105 and the glass cover plate 104.

It should be noted that, in the embodiment of the present disclosure, the photosensitive device 204 may be a vertical PIN photodiode, and the implementation principle of the vertical PIN photodiode is the same as that of the planar PIN photodiode in the above embodiment, and details are not described herein. The cathode 304 is located on the encapsulation layer 105 and is closer to the light-emitting device 202 than the anode 300. The cathode 304 is an non-transparent electrode, and the anode 300 is a transparent electrode. The non-transparent electrode may shield the light directly emitted from the light-emitting device 202, thereby avoiding the interference on the light reflected by the valley and ridge of the finger, and improving the accuracy of the fingerprint identification. The cathode 304 is coupled to the first electrode of the fingerprint identification transistor 203 through a fourth via hole H4 that extends through the encapsulation layer in the third via hole H3.

Figure 10:
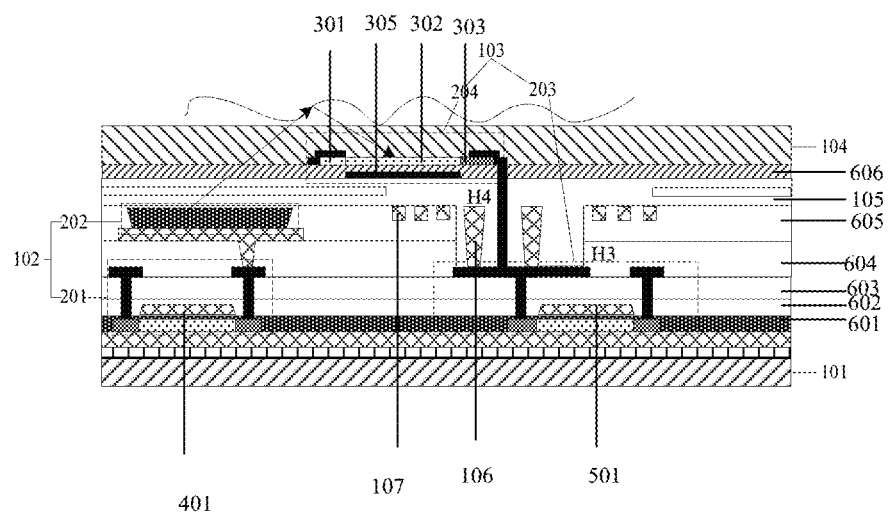
FIG. 10 is a schematic diagram showing a structure of a display substrate provided in an embodiment of the present disclosure.

In some embodiments, as shown in FIG. 10, the display substrate further includes: an encapsulation layer 105 covering the light-emitting device 202, which is a stacked layer of two inorganic encapsulation layers and one organic encapsulation layer; an insulating layer 606, which is an organic insulating layer or an inorganic insulating layer and located on a side of the encapsulation layer 105 distal to the base substrate 101.

The photosensitive device 204 includes a first semiconductor layer 301, an intrinsic semiconductor layer 302, and a second semiconductor layer 303 disposed in the same layer. The intrinsic semiconductor layer 302 is located between the first semiconductor layer 301 and the second semiconductor layer 303. The photosensitive device 204 further includes a light-shielding layer 305 between the intrinsic semiconductor layer 302 and the encapsulation layer 105. An orthogonal projection of the light-shielding layer 305 on the base substrate 101 completely overlaps an orthogonal projection of the intrinsic semiconductor layer 302 on the base substrate 101.

It should be noted that, in the embodiment of the present disclosure, the photosensitive device 204 may be a planar PIN photodiode, and the implementation principle of the planar PIN photo diode is the same as that of the planar PIN photodiode in the above embodiment, and is not described herein again. The P-type semiconductor layer 301, the I-type semiconductor layer 302 and the N-type semiconductor layer 303 of the photosensitive device are located on a side of the insulating layer 606 distal to the base substrate 101.

The light shielding layer 305 may shield light directly emitted from the light-emitting device 202, so as to avoid interference on light reflected by the valley and ridge of the fingerprint, thereby improving the accuracy of fingerprint identification. It can be understood that the encapsulation layer 105 of the display substrate is generally provided with touch control units thereon, and the touch control units may be a self-capacitance touch control structure or a mutual-capacitance touch control structure. In a specific example, the touch control unit may be a mutual-capacitance touch control structure, which includes a first electrode and a second electrode stacked and insulated from each other. During the manufacturing process, the upper and lower electrodes of the vertical PIN photodiode shown in FIG. 9 may be respectively disposed in the same layer as the two electrodes of the touch control unit, so that the vertical PIN photodiode is integrated with the touch control unit. The two electrodes of the planar PIN photodiode shown in FIG. 10 may also be disposed in the same layer as any one of the electrodes of the touch control unit, so that the planar PIN photodiode is integrated with the touch control unit. A suitable integration manner may be selected as actual needed, which is not limited herein.

In some embodiments, as shown in FIGS. 9 and 10, the second electrode of the photosensitive device 204 is coupled to the first electrode of the second thin film transistor 203 through a fourth via hole H4 that extends through the encapsulation layer 105 in the third via hole H3. The display substrate further includes spacers 106; each of the spacers 106 is located in the third via hole H3, covered by the encapsulation layer 105 in the third via hole H3. The spacer 106 is located between the light-emitting device 202 and the fourth via hole H4 along a direction parallel to the base substrate 101. The fourth via hole H4 is surrounded by the spacers 106 and in the middle of the spacers 106.

It should be noted that, in the embodiment of the present disclosure, since the film layers of the photosensitive device 204 are located on the encapsulation layer 105, when the film layer is coupled to other devices covered by the encapsulation layer 105, it is necessary to perforate the encapsulation layer 105 (e.g., the fourth via hole H4). The spacers 106 can prevent moisture and the like from penetrating into the film layers of the light-emitting device 202 through the fourth via hole H4, so as to improve the reliability and prolong the service life of the light-emitting device 202. It is understood that the spacers may also be disposed around other via holes penetrating the encapsulation layer, as shown in FIGS. 9 and 10, so as to prevent moisture from penetrating through the via holes and affecting the performance of the light-emitting device 202. In practical applications, the encapsulation layer 105 is generally formed by a three-layer structure of an inorganic material layer, an organic material layer and an inorganic material layer, and specific materials thereof are not listed here. It should be further noted that the spacers 106 may be made of the same material as an interlayer insulating layer covering the first thin film transistor 201 and the second thin film transistor 203 in the display substrate, and alternatively, the spacers 106 may be made of the same material as a planarization layer covering the first thin film transistor 201 and the second thin film transistor 203 in the display substrate, and alternatively the spacers 106 may be made of a material of another film layer. During the manufacturing process, a plurality of spacers can be formed, and one of the spacers can be etched, so that the fourth via hole H4 is formed, and the manufacturing steps and the manufacturing cost are reduced.

In some embodiments, as shown in FIGS. 9 and 10, the display substrate further includes a blocking dam 107. The blocking dam 107 is located on a side of the pixel defining layer 605 proximal to the encapsulation layer 105. The blocking dam 107 is disposed in the same layer as the spacer 106 and between the spacer 106 and the light-emitting device 202.

It should be noted that the blocking dam 107 may be disposed around the spacers 106 (e.g., all of the spacers 106), thereby preventing the moisture from permeating into the film layers of the light-emitting device 202 from the region where the spacers 107 are located, improving reliability, and prolonging the service life of the light-emitting device 202.

An embodiment of the present disclosure provides a method for manufacturing the display substrate having a fingerprint identification region.

The manufacturing method includes: forming a plurality of display units on a base substrate 101; and forming a fingerprint identification unit including a fingerprint identification transistor 203 and a photosensitive device 204 at a gap between adjacent display units in the fingerprint identification region such that a first electrode of the fingerprint identification transistor 203 is coupled to a second electrode of the photosensitive device 204.

The manufacturing method of the present disclosure further includes various manufacturing steps corresponding to the structure of the display substrate of the present disclosure, which are not described again herein.

The embodiment of the present disclosure provides a display apparatus, which includes the display substrate according to any one of the above embodiments and a driving circuit for driving the display substrate. The display apparatus may be a mobile phone, a tablet computer, a vehicle-mounted central control device, and other terminal devices, and the implementation principle of the display apparatus is similar to that of the display substrate according to the above embodiments, and is not described again herein.

Figure 11:
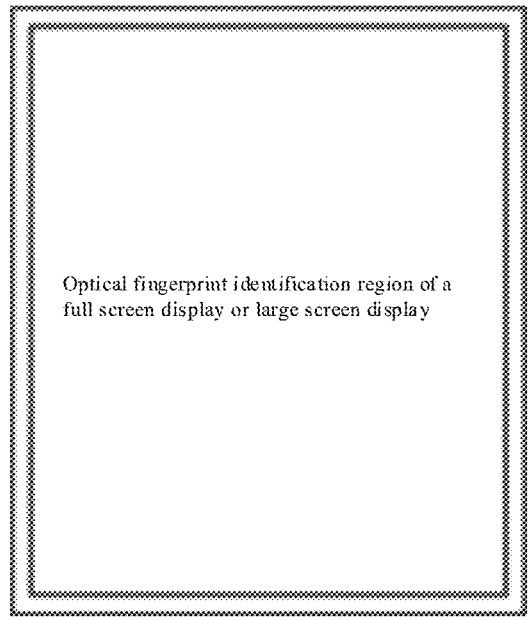
FIG. 11 is a schematic diagram showing an optical fingerprint identification region of a full screen display or large screen display.

FIG. 11 is a schematic diagram showing an optical fingerprint identification region of a full screen display apparatus or a large screen display apparatus. As shown in FIG. 11, the optical fingerprint identification region of the full screen display apparatus or the large screen display apparatus may occupy the entire display region of the display apparatus, that is, fingerprint identification may be implemented in the entire display region of the display apparatus.

Figure 12:
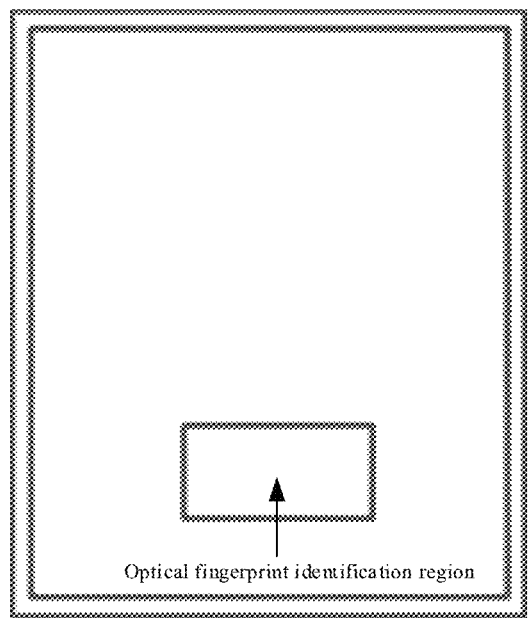
FIG. 12 is a schematic diagram showing a partial optical fingerprint identification region.

FIG. 12 is a schematic diagram showing a partial optical fingerprint identification region. As shown in FIG. 12, the optical fingerprint identification region may occupy a portion of a display region of the display apparatus.

In the display substrate of the display apparatus according to the embodiment of the present disclosure, the second thin film transistor and the photosensitive device of the fingerprint identification unit are located in the gap between the adjacent display units, so that the fingerprint identification function is realized, meanwhile, the thickness of the whole display substrate is not increased, which facilitates the lightness and thinning of the display substrate. In addition, a pass from the photosensitive device to the valley and ridge of the finger has a small distance, the light propagating over the pass has a reduced transmission distance and a low loss of light signals, so that the fingerprint identification precision can be improved.

It should be understood that the above implementations are merely exemplary embodiments for the purpose of illustrating the principles of the present disclosure, however, the present disclosure is not limited thereto. It will be apparent to those skilled in the art that various changes and modifications can be made without departing from the spirit and essence of the present disclosure, which are also to be regarded as falling in the scope of the present disclosure.

What is claimed is:

1. A display substrate having a fingerprint identification region, the display substrate comprising:
   a base substrate;
   a display unit on the base substrate and comprising a display thin film transistor and a light-emitting device, a second electrode of the display thin film transistor being coupled to a first electrode of the light-emitting device;
   a fingerprint identification unit at a gap between adjacent display units in the fingerprint identification region and comprising a fingerprint identification transistor and a photosensitive device;
   a gate insulating layer on a side of an active layer of the display thin film transistor and an active layer of the fingerprint identification transistor distal to the base substrate;
   a pixel defining layer on a side of the display thin film transistor and the fingerprint identification transistor distal to the base substrate; and
   an encapsulation layer configured to encapsulate the display unit, located on a side of the pixel defining layer distal to the display thin film transistor and the fingerprint identification transistor, and located in a first via hole penetrating through the pixel defining layer, wherein the photosensitive device is a vertical PIN photodiode and located on a side of the encapsulation layer away from the pixel defining layer, and a second electrode of the photosensitive device is coupled to a first electrode of the fingerprint identification transistor through a second via hole penetrating through the encapsulation layer in the first via hole.

2. The display substrate of claim 1, further comprising:
an interlayer insulating layer on a side of the gate insulating layer distal to the base substrate and covering a gate electrode of the display thin film transistor and a gate electrode of the fingerprint identification transistor; and
an interlayer dielectric layer on a side of the interlayer insulating layer distal to the base substrate.

3. The display substrate of claim 2, further comprising:
a planarization layer on a side of the interlayer dielectric layer distal to the base substrate;
an insulating layer on a side of the encapsulation layer distal to the pixel defining layer; and
a cover plate on a side of the insulating layer distal to the encapsulation layer.

4. The display substrate of claim 3, wherein
the vertical PIN photodiode comprises the second electrode, an N-type semiconductor layer, an I-type semiconductor layer, a P-type semiconductor layer, and a first electrode arranged on the encapsulation layer along a perpendicular direction from the encapsulation layer to the cover plate,
the first electrode is a transparent electrode,
the second electrode is a non-transparent electrode and is configured to block light emitted from the light-emitting device, and
the photosensitive device is located in the insulating layer and between the encapsulation layer and the cover plate.

5. The display substrate of claim 4, further comprising a spacer in the first via hole, covered by the encapsulation layer in the first via hole, and between the light-emitting device and the second via hole along a horizontal direction from the display thin film transistor to the fingerprint identification transistor.

6. The display substrate of claim 5, further comprising a block dam in the pixel defining layer close to the encapsulation layer and between the spacer and the light-emitting device along the horizontal direction from the display thin film transistor to the fingerprint identification transistor.

7. The display substrate of claim 1, wherein
the light-emitting device is one of red, green, blue subpixels.

8. A display apparatus comprising the display substrate of claim 1.

9. A method for manufacturing a display substrate, wherein the display substrate having a fingerprint identification region, and the method comprises:
forming a display unit on a base substrate, wherein the display unit comprises a display thin film transistor and a light-emitting device, and a second electrode of the display thin film transistor is coupled to a first electrode of the light-emitting device;
forming, at a gap between adjacent display units in the fingerprint identification region, a fingerprint identification unit comprising a fingerprint identification transistor and a photosensitive device
forming a gate insulating layer on a side of an active layer of the display thin film transistor and an active layer of the fingerprint identification transistor distal to the base substrate;
forming a pixel defining layer on a side of the display thin film transistor and the fingerprint identification transistor distal to the base substrate; and
forming, an encapsulation layer for encapsulating the display unit, on a side of the pixel defining layer distal to the display thin film transistor and the fingerprint identification transistor and in a first via hole penetrating through the pixel defining layer, wherein
the photosensitive device is a vertical PIN photodiode and located on a side of the encapsulation layer away from the pixel defining layer, and a second electrode of the photosensitive device is coupled to a first electrode of the fingerprint identification transistor through a second via hole penetrating through the encapsulation layer in the first via hole.

* * * * *